United States Patent [19]
Pique et al.

[11] Patent Number: 5,458,686
[45] Date of Patent: Oct. 17, 1995

[54] PULSED LASER PASSIVE FILTER DEPOSITION SYSTEM

[75] Inventors: Alberto Pique, Bowie, Md.; Thirumalai Venkatesan, Washington, D.C.; Steven Green, Greenbelt, Md.

[73] Assignee: Neocera, Inc., Beltstville, Md.

[21] Appl. No.: 398,146

[22] Filed: Mar. 3, 1995

[51] Int. Cl.⁶ ................................................ C23C 14/00
[52] U.S. Cl. ........................... 118/722; 118/715; 118/726
[58] Field of Search .................................... 118/722, 726, 118/715

[56] References Cited

U.S. PATENT DOCUMENTS

| | | | |
|---|---|---|---|
| 5,015,492 | 5/1991 | Venkatesan | 118/620 |
| 5,126,165 | 6/1992 | Akihama | 118/726 |
| 5,316,585 | 5/1994 | Okamoto | 118/726 |
| 5,334,252 | 8/1994 | Yoshida | 118/726 |

*Primary Examiner*—Richard Bueker
*Attorney, Agent, or Firm*—Morton J. Rosenberg; David I. Klein

[57] ABSTRACT

This invention directs itself to a pulsed laser passive filter deposition system (10) which provides a blocking and transparent mask mechanism (34) placed between a target (14) and a substrate (12) to be coated. The blocking and transparent mask mechanism (34) includes a blocking member (36) which casts a blocking shadow having a greater cross-sectional area than the substrate (12), to block linearly travelling clustered species particulates (22) from impinging on the substrate (12). The blocking and transparent mask mechanism (34) also includes annularly shaped disk members (38 and 44) having openings (40 and 46) formed in a central portion to allow passage of the atomic species (20) of the composition being coated on the substrate (12) where the atomic species (20) is deflected by impingement with background gas molecules (26). In this manner, the substrate (12) is coated with the atomic species (20) in a uniform coating without having the clustered species (22) being coated on the substrate (12).

20 Claims, 4 Drawing Sheets

5,458,686

PULSED LASER PASSIVE FILTER DEPOSITION SYSTEM

BACKGROUND OF THE INVENTION

This invention directs itself to a system for uniformly coating a substrate using a pulsed laser technique. In particular, this invention relates to a pulsed laser passive filter deposition system to create a dimensionally uniform coating of a composition having a required morphology of thin films being deposited on a substrate. Still further, this invention directs itself to a pulsed laser passive filter deposition system where a blocking and transparent mask mechanism is interposed between a target and the substrate to be coated. Still further, this invention relates to a pulsed laser passive filter deposition system which includes a blocking and transparent mask mechanism interposed between the target and the substrate upon which deposition is taking place wherein the blocking and transparent mask mechanism is substantially transparent to the atomic species of the composition being deposited while providing an intersecting barrier to a clustered species being deposited. Further, this invention directs itself to a pulsed laser passive filter deposition system wherein a blocking and transparent mask provides a blocking shadow in the plane of tile substrate being coated whereby linearly displaced clustered species of the depositing composition are intersected by a blocking member while simultaneously the atomic species of the composition is deflected through impingement with background gas molecules to provide a substantially random and tortuous path direction of the atomic species to the substrate being coated. Still further, this invention directs itself to a passive filter system which includes a blocking member for intersecting linearly directed clustered species which is mounted to a transparent member allowing passage therethrough at differing directional path angles, the atomic species of the composition which is being coated upon the substrate. Still further, this invention directs itself to a passive filter which incorporates a blocking member in combination with a plurality of annularly or otherwise closed opening contoured disk members which successively reduce the impingement probability of the evaporative or clustered species of the coating composition on the substrate while allowing passage therethrough of the atomic species having differing path directions.

PRIOR ART

Various techniques to provide a uniform coating on a substrate from laser ablation of a target are known in the art. The best prior art known to Applicants include U.S. Pat. Nos. 5,304,406; 5,017,277; 4,987,007; 5,049,405; 5,227,204; 5,212,148; 5,168,097; 5,281,575; 5,248,659; 5,258,366; 5,250,511; 5,098,737; 5,015,492; and, 5,126,165.

In some prior art methods, there is provided an off-axis deposition technique where the substrate to be coated is mounted at an angle in an off-axis direction to the target in a manner to reduce the clustered species deposition on the substrate, however, although this provides some reduction of the clustered species which may be in the form of droplets, such does not provide for an efficient and highly uniform film deposition on the substrate.

In another prior art technique, laser power set near the threshold of the target boiling point and the explosive spouting of the melted target is substantially suppressed. However, such does not provide for the complete elimination of the clustered species particles but only reduces the amount without blocking such from the substrate to be coated.

Other prior art systems as shown in U.S. Pat. No. 5,126,165 direct themselves to a laser deposition system where a substrate is coated with a film of material from a plasma from a laser which irradiates the target. A shielding plate having an opening is provided as a selected transmission mechanism. However, in such systems, the laser beam is angled to provide for different components of the material being emitted from the target in different directions. Thus, this type of prior art system is analogous to an off-axis technique which does not provide for the elimination of the clustered species of the material being deposited.

In other systems such as that shown in U.S. Pat. No. 5,015,492, there is provided a masking technique to mask out predetermined portions of a laser irradiated evaporant of a material. A pulsed laser is controlled to provide congruent evaporation of the material and a partition is provided with an aperture to allow only a central portion of the evaporated plume to deposit on the substrate. However, such prior art systems do not provide for the elimination of the clustered species or droplets of material being deposited on the substrate.

SUMMARY OF THE INVENTION

This invention provides for a pulsed laser passive filter deposition system which includes a vacuum chamber containing background gas molecules. A substrate to be uniformly coated is mounted within the vacuum chamber and a target member is longitudinally displaced from the substrate. The target member is impinged by a pulsed laser for emitting a thin film coating composition as a multiplicity of particulates both as an atomic species and as an evaporating or clustered species in a generally predetermined contour emission pattern from the target member. A masking mechanism is positionally located between the substrate and the target member for blocking a substantially linear path direction of the clustered species. The blocking mechanism provides a blocking shadow cross-sectional area greater than a cross-sectional area of the substrate to be coated in the plane of the substrate, whereby the evaporation or clustered species is blocked from impinging on the substrate and the atomic species is deflected by the background gas molecules to provide a deflection path of the atomic species around and through the masking mechanism for impingement on the substrate.

DESCRIPTION OF THE PREFERRED EMBODIMENTS

Figure 1:
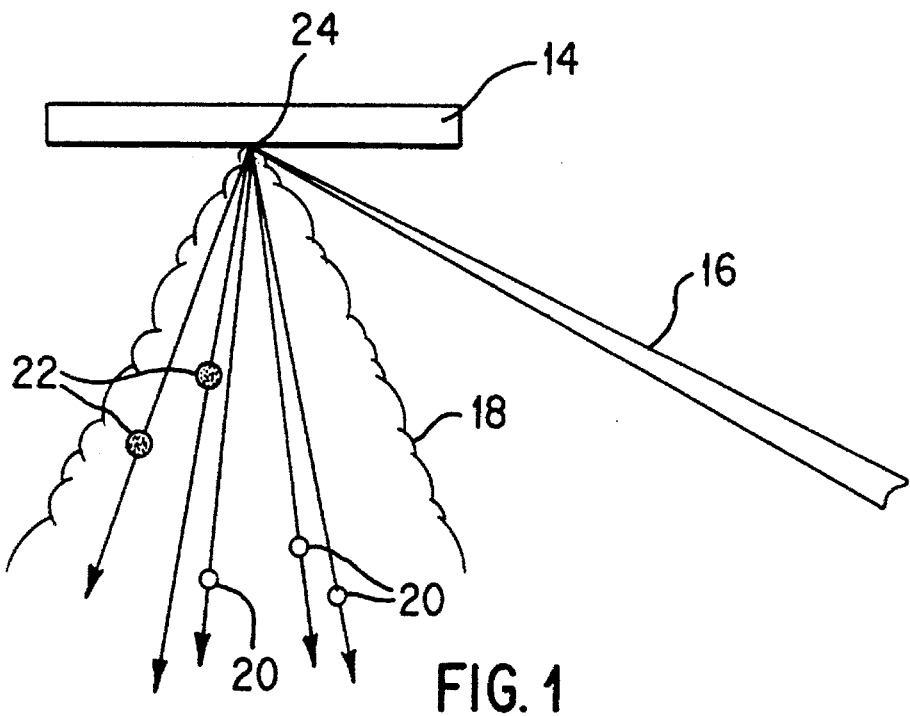
FIG. 1 is a schematic drawing showing a pulsed laser beam impinging on a target and emitting a plume containing both the clustered species and the atomic species of the target composition.

Referring now to FIGS. 1–5, there is shown pulsed laser passive filter deposition system 10 for deposition of thin films having varying compositions on substrates 12. The compositional make-up of the thin films may be YBCO superconducting films and further may be any one of a number of high temperature superconducting films such as BiSrCaCuO, as well as TlBaCaCuO, and other compositions having similar crystal structure as that of known superconducting compounds, however, it is to be understood that the pulsed laser passive filter deposition system 10 is not limited to such types of superconducting films. Additionally, the pulsed laser beam 16 referred to in these paragraphs may be produced by an excimer laser of the KrF type delivering optical pulses at predetermined pulse rates with high energy densities, however, the particular laser being used is not important to the inventive concept as herein described with the exception that such produce a pulsed laser beam 16 for impinging on target 14 and causing ablative irradiation of the composition to be deposited on substrate 12.

It is further to be understood that substrate 12 is generally mounted in a substrate holder and has a heater backing member for heating substrate 12 to a predetermined temperature. However, the holder for the substrate 12 may be any one of a known number of holding mechanisms not important to the inventive concept as herein discussed.

Pulsed laser deposition techniques are well-known in the art for the fabrication of thin film superconductors on substrates 12. Pulsed laser techniques are extremely efficient and are used due to the fact that such provide for a high rate of growth and transfer of the composition from the target 14 to the substrate 12. Although providing for a high rate of growth and increased efficiency in the transfer of the compositions to be deposited on substrate 12 from target 14, pulsed laser deposition has encountered unique problems associated with this type of deposition due to the high energy and explosive action at the impact point 24 on the target 14. Thus, problems have been found wherein defective morphology of the thin films coated on the substrates 12 has been experienced as well as non-uniform and irregular thin film surfaces being observed. Further, due to the explosive mechanism and resulting from the non-uniformity of the coating on substrates 12, particles have been observed on many substrates 12 coated by the pulsed laser deposition technique.

As previously stated, the disadvantageous problems associated with using pulsed laser deposition techniques in part results from the high energy laser beam 16 impinging target 14. The pulsed laser technique is highly explosive and due to the fact that the temperature of the targets 14, even for a short period of time, reach the boiling point due to the irradiation of the pulsed laser beam, such causes explosive spouting of the melted target with possibly drops of the film composition or ablated species to be emitted from target 14.

As shown in FIG. 1, pulsed laser beam 16 impinges on target 14 with a resulting plume 18 being emitted from target 14 in a generally irregular pattern contour, however shown in FIG. 1 as a generally conical plume geometry for purposes of illustration.

The plume 18 contains both heavy composition particulates and what may be termed light composition particulates hereinafter referred respectively as clustered species 22 and atomic species 20.

Thus, plume 18 is formed of both the atomic species 20 and clustered species 22 generally exiting from target 14 in a linear direction from the impact point 24, as is seen in the Figures.

The major problem involved in using the pulsed laser deposition technique results from impingement of the clustered species 22 on substrate 12. Impingement by clustered species 22 on substrate 12 provides for the previously described anomalies and are particularly evident when the user is depositing thin films on substrates 12.

The basic concept of pulsed laser passive filter deposition system 10 is to block out and eliminate the clustered species 22 from impinging on substrate 12 while providing a substantially transparent path direction of atomic or molecular species 20 to substrate 12. Thus, as will be described in following paragraphs, pulsed laser passive filter deposition 10 is provided to block particles 22 in a preferential manner and allow atomic or molecular species 20 to impinge and be deposited on substrate 12.

Figure 3:
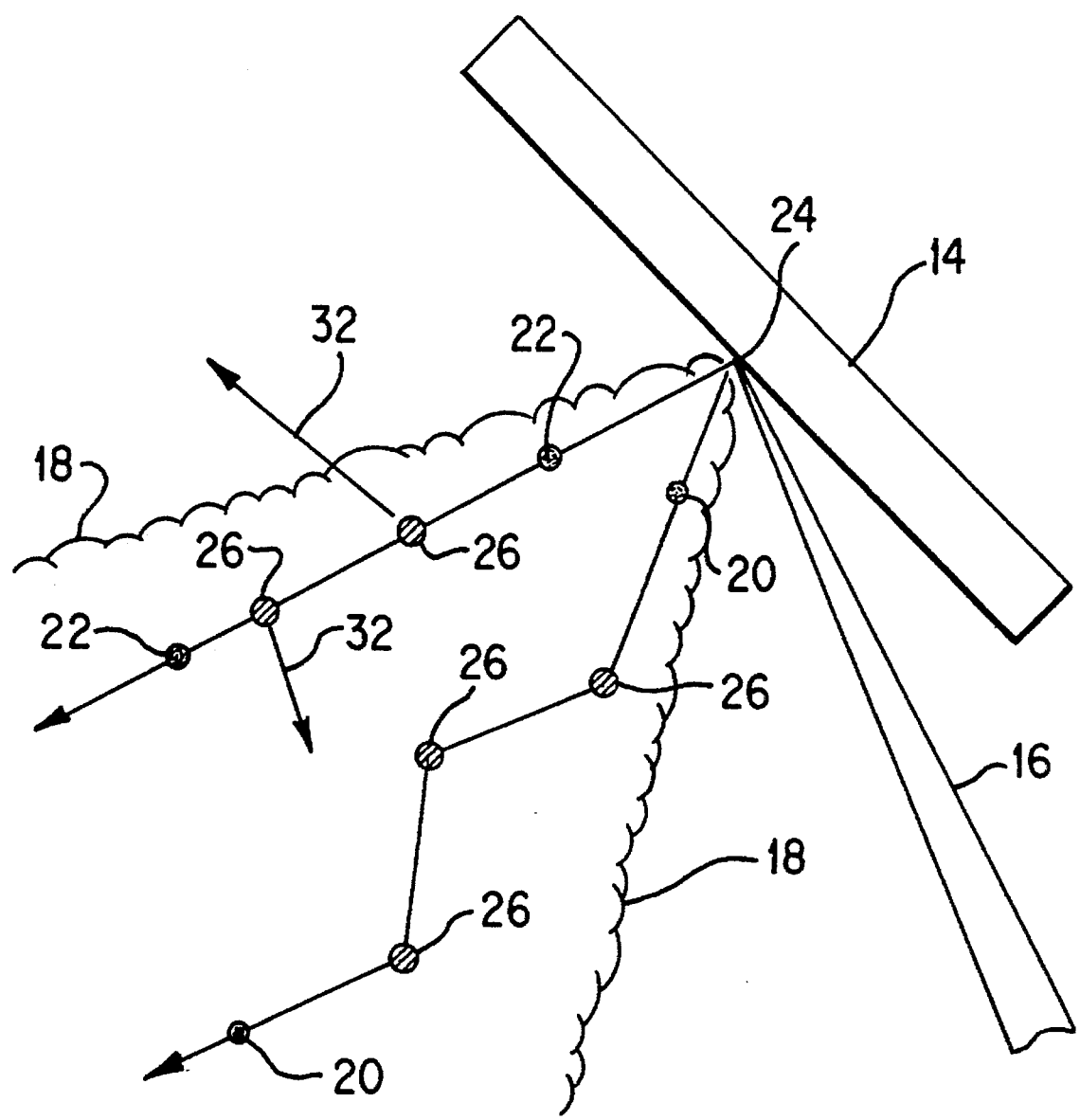
FIG. 3 is a schematic representation of linear path travel of the clustered species from the target and the travel path of the atomic species upon impingement with background gas molecules.

The overall concept of the principle herein described is schematically represented in FIG. 3 and is directed to the fact that in the presence of background gas molecules 26 that the clustered species 22 maintain a substantially linear path travel direction even when intersecting background gas molecules 26 whereas the atomic species 20 are deflected from background gas molecules 26 and are driven in differing path directions. In this manner, the linear path directions of the clustered species 22 may be predicted and blocked from impinging on substrate 12. Opposingly, the atomic species 20 upon intersecting background gas molecules 26 are deflected into a tortuous path direction and may be bent around or passed through the overall blocking mechanism as herein described.

Figure 2:
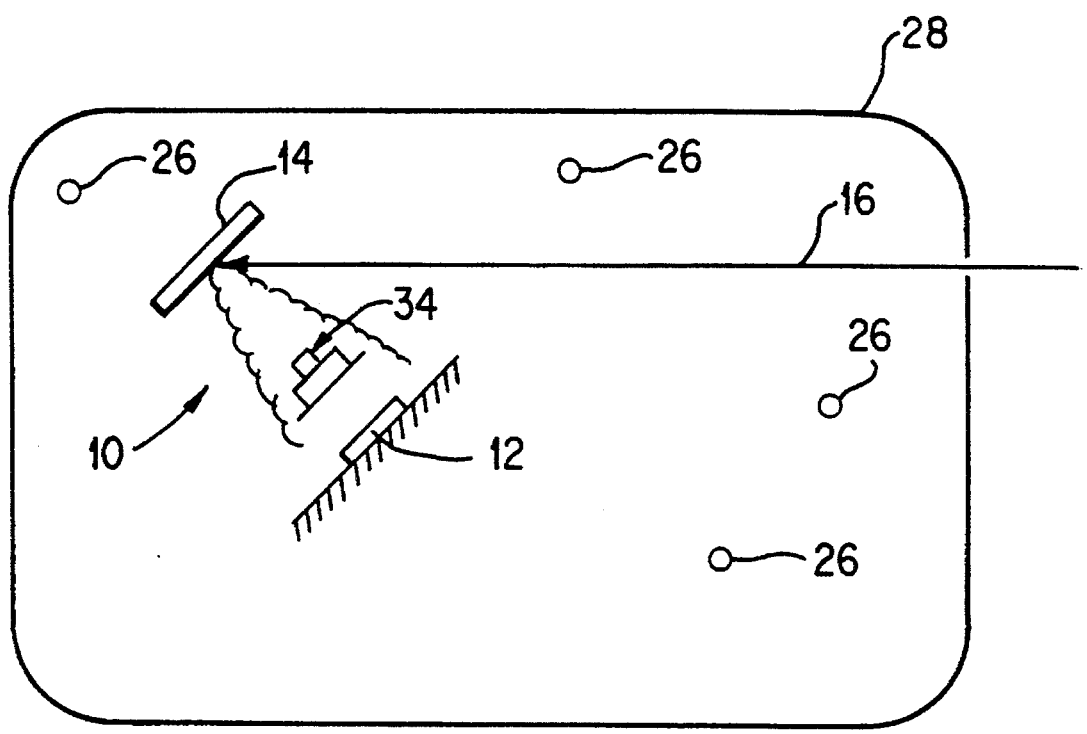
FIG. 2 is a schematic view of the pulsed laser passive filter deposition system mounted within a vacuum chamber containing background gas molecules.

As seen in FIG. 2, vacuum chamber 28 provides for a closed volume within which substrate 12 and target 14 are mounted. Vacuum chamber 28 is provided with a background gas atmosphere having background gas molecules 26 contained therein. The pulsed laser beam 16 impinges on target 14 emitting plume 18 containing both atomic species 20 and clustered species 22 which initially travel in a generally linear direction within the overall plume 18.

Referring to FIG. 3 showing a schematic diagram of the process, it is seen that the heavy background gas molecules 26 act as a deflector for atomic species 20 as the atomic specie particles 20 intersect and are reflected from background gas molecules 26. Opposingly, the clustered specie particles 22 having a heavier particle weight when striking background gas molecules 26 substantially maintain their travel path in linear direction 30 while deflecting background gas molecules 26 out of the path of the linear direction 30.

As can be seen in FIG. 3, background gas molecules 26 may be deflected from path 30 in possibly a direction represented by directional arrows 32 out of the path direction 30 of clustered species 22. Alternatively, again as seen in FIG. 3, atomic species 20 intersecting and being reflected from background gas molecules 26 have a path direction transfer and change resulting in a highly random atomic species direction travel after a number of impingements or collisions with background gas molecules 26.

It is seen that by positionally locating a blocking mask between target 14 and substrate 12 will allow impingement of clustered species 22 to impinge directly on the blocking mask while permitting atomic species 20 to essentially bend around the mask by deflection from the initial linear direction to a multiplicity of directions which then impinge upon the substrate 12.

However, by merely providing a blocking mask, having a dimension which produces a shadow cross-sectional area in the plane of the substrate less than the substrate 12 to be coated has produced further problems which have been evidenced. These problems direct themselves to the outer peripheral edges of the substrate 12 which will have a thicker coating than the central portion or section of substrate 12. This does not lead to a planar uniform coating of substrate 12 and has been solved by use of the pulsed laser passive filter deposition system 10 as herein described. By using system 10 placed between target 14 and substrate 12, there is produced a blocking mechanism for the clustered species 22 while simultaneously providing a transparent mechanism for passage therethrough of the atomic species 20 to provide a substantially uniformly thick coating on substrate 12 with little or no morphology defects being evidenced.

Through use of the laser passive filter deposition system 10 of the subject invention the density of atomic species 20 impinging and being deposited on substrate 12 is highly homogeneous throughout the planar cross-section of substrate 12 resulting in a highly efficient coating with no resulting clustered species 22 being found on substrate 12. Thus, it has been found that by providing mask mechanism 34 acting as a complete block to the clustered species 22 and substantially transparent to atomic species 20 and allows a uniform coating to be deposited on substrate 12.

Figure 4:
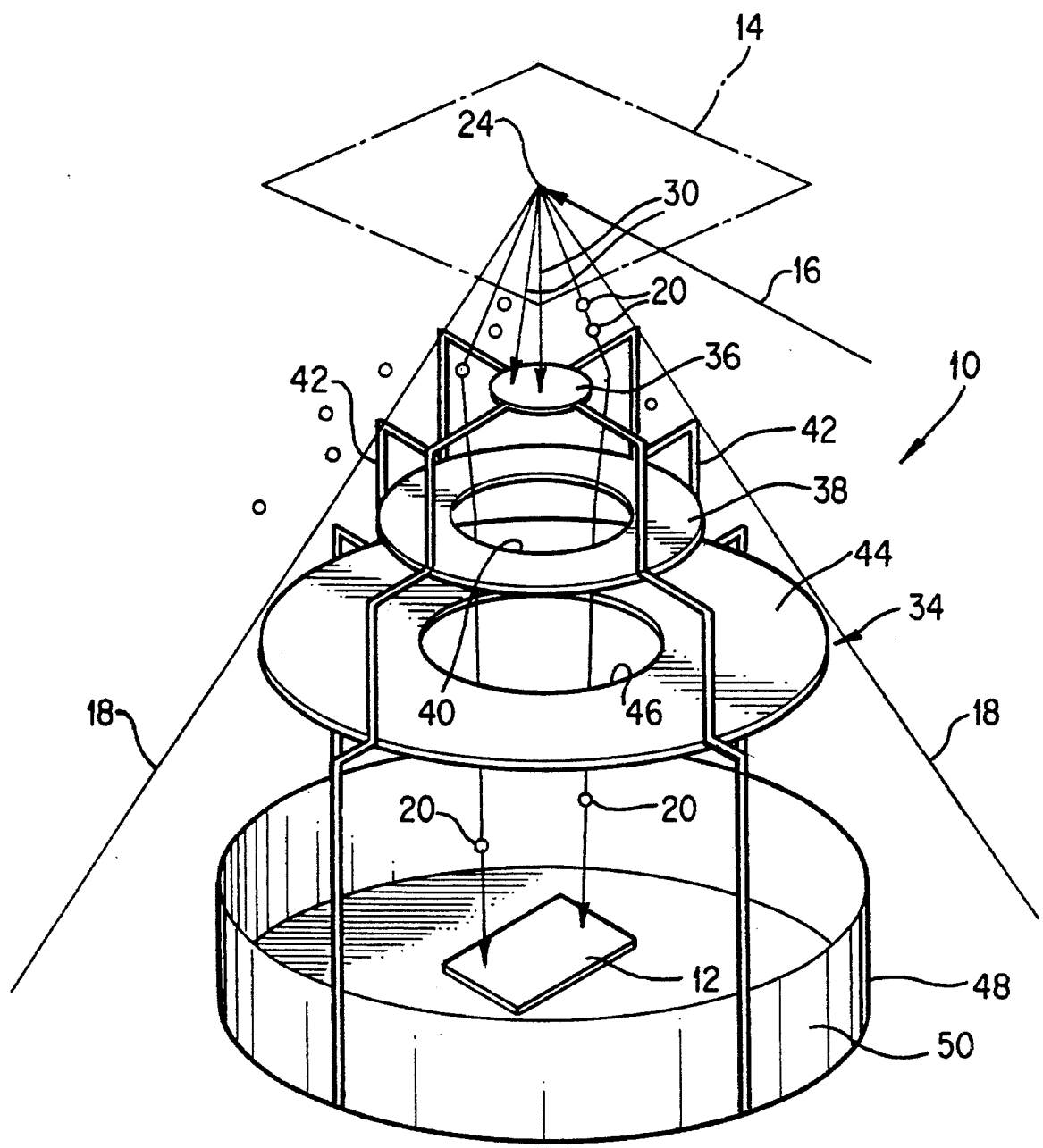
FIG. 4 is a perspective view of the blocking and transparent mask used in the pulsed laser passive filter deposition system; and, FIG. 5 is a cross-sectional view of the blocking and transparent masking mechanism of the subject invention.
Figure 5:
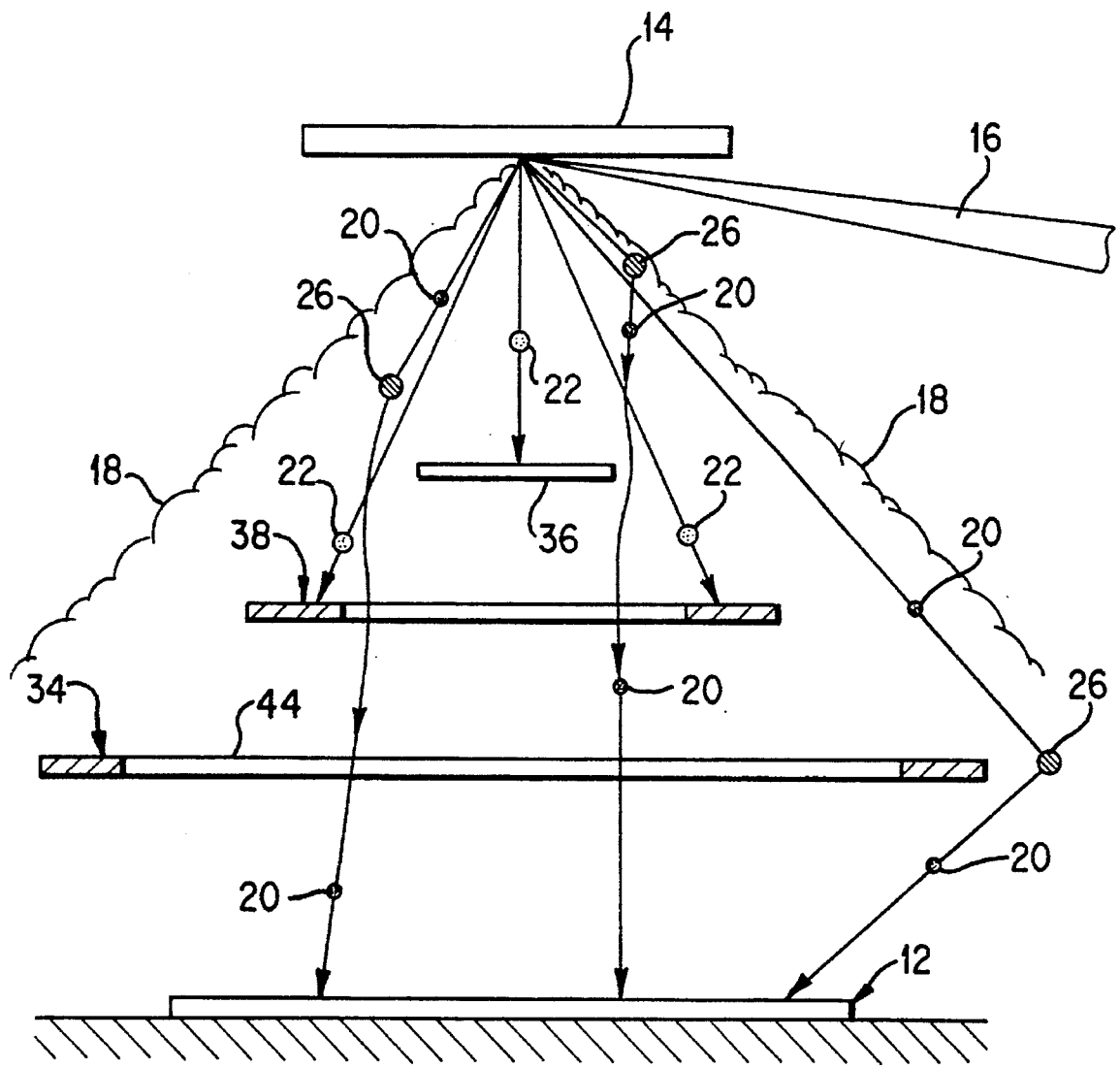

Blocking and transparent mask mechanism 34 is more clearly depicted in FIGS. 2, 4 and 5. Mask mechanism 34 is positionally located between substrate 12 and target 14 for substantially blocking the linear path direction of clustered species 22. Masking mechanism 34 is formed in a geometry such that the blocking mechanism 34 forms a blocking shadow area in a plane of substrate 12 having a cross-sectional area greater than the cross-sectional area of the substrate to be coated. In this manner, the clustered species 22 is blocked from impinging on substrate 12. Atomic species 20 is deflected by a series of collisions with background gas molecules 26 to provide a deflection path of atomic species 20 around and through blocking and transparent mask 34 for impingement on substrate 12 in a substantially random manner to produce a uniformly thick coating on substrate 12.

Blocking and transparent mask 34 is positionally located at a predetermined distance between target member 14 and substrate 12 at a distance where a complete blocking shadow in the plane of substrate 12 is produced which has a cross-sectional area equal to or greater than the cross-sectional area of substrate 12. The specific dimensional sizing of transparent mask 34 is not important to the inventive concept as herein described with the exception that such produce the aforementioned shadow blocking area in the plane of substrate 12. Such dimensions are based upon the particular geometries of the target, substrate, mask mechanism 34 geometrical relationships which are easily calculated.

Referring now to FIGS. 4 and 5 there is shown blocking and transparent mask 34 which includes blocking member 36 formed of solid construction and positionally located between target member 14 and substrate 12 wherein blocking member 36 includes a cross-sectional area of a dimension where a generally conical contour pattern is produced having a cross-sectional area in a plane of the substrate 12 less than the cross-sectional area of substrate 12. In this manner, linearly directed paths 30 of clustered species 22 impinge directly on blocking member 36 and any linear path within plume 18 would be intercepted by blocking member 36. As thus seen essentially all of clustered species 22 impinge and are blocked by blocking member 36. However, if only blocking member 36 were used as the masking mechanism 34, the outer or peripheral edges of substrate 12 would have a thicker coating than the central portion which would lead to non-uniformity of coating thickness. Thus, the use of a single blocking member 36 may substantially solve the problem of the clustered species 22 impinging on substrate 12, but does not relieve the problem of a uniform film coating on substrate 12.

In order to attack the problem of uniform coating on substrate 12, first annularly contoured disk or first partially transparent mask member 38 is mounted in a longitudinally displaced manner from blocking member 36. First partially transparent mask member 38 may be in the form of an annularly contoured disk having opening 40 formed in a central portion thereof, as is seen in FIG. 4. Blocking member 36 as shown has a contour in the form of a disk member and includes a diameter dimension for blocking member 36. First annularly contoured disk opening 40 is generally axially aligned with blocking member 36 and includes an external diameter greater than a diameter of blocking member 36 and an internal diameter equal or larger than the diameter dimension of blocking member 36. In this manner, first partially transparent masking member 38 provides a blocking surface defined by the solid disk portion between the internal diameter and external diameter of member 38 while providing a transparent area or opening area 40 through which atomic species 20 having been deflected by background gas molecules 26 may pass. Blocking member 36 and first partially transparent mask member 38 are fixedly secured each to the other by wire securement members 42 which are in themselves fixedly secured to peripheral edges of both first partially transparent mask member 38 and blocking member 36. Wire members 42 may be formed of some type of thin stainless steel construction wire, not important to the inventive concept as herein described, with the exception that such provide the structural integrity to maintain blocking member 36 and first partially transparent mask member 38 in fixed securement to each other and accept the structural loads applied by the environment. Wire securement members 42 may be welded or otherwise secured to the peripheral edges of members 38 and 36.

As seen in both FIGS. 4 and 5, first partially transparent mask member 38 takes the form of an annularly contoured disk member in conjunction with a contour of blocking member 36 which is a solid disk contour. It is to be understood that the particular contouring of blocking member 36 and first annularly contoured disk 38 are not important to the inventive concept as herein described, with the exception that blocking member 36 provide an intersecting path for a linearly travelling atomic or clustered species 20 and 22 whereas first partially transparent mask member 38 provide for both a blocking surface, as well as an opening 40 which allows atomic species 20 to pass therethrough and is thus at least partially transparent to the overall plume 18 as to the atomic species 20.

In order to further refine blocking and transport mask 34, there is provided second partially transparent mask 44 contoured as shown in FIG. 4 into a second annularly contoured disk member. Second annularly contoured disk member or partially transparent mask 44 includes second opening 46 which is generally axially aligned with first opening 40 and blocking member 36. Second partially transparent mask 44 is longitudinally displaced from first partially transparent mask 38 and includes an outer diameter which is generally greater than the outer diameter of first annularly contoured disk 38. Second opening 46 may be equal to, or greater than opening 40 to allow passage therethrough of atomic species 20. As can be seen from the Figures and the previous description, clustered species 22 travelling in a linear direction from impact point 24 will impinge on blocking member 36 or the solid surfaces of first or second annularly contoured disks 38 or 44. Additionally, atomic species 20 after having been deflected from background gas molecules 26 contained within chamber 28, have a tortuous path which may pass through openings 40 or 46 to impinge on substrate 12, thus giving a uniform coating of the thin film composition on substrate 12.

Additionally, where a blocking member 36 is used in conjunction with both a first and second partially transparent mask member 38 and 44, wire securement members 42 may be fixedly secured by welding or some other technique to the peripheral edges of each of the three elements 36, 38, and 44 as previously described.

Overall blocking and transparent mask 34 may further include base shield member 48 having a base shield wall member 50. Base shield member 48 as shown in FIG. 4 is provided in the form of a cylindrical contour having a diameter greater than the largest dimension of substrate 12. Base shield member 48 may be mounted on a base surface plane upon which substrate 12 is mounted. Wire securement members 42 are seen to be fixedly secured to base shield wall member 50, as well as blocking member 36, first annularly contoured disk member 38 and second annularly contoured disk member 44. The fixed securement of wire securement or rod securement members 42 to base shield wall member 50 may be by welding or some like technique, not important to the inventive concept as herein described.

In this manner, there is provided a blocking and transparent mask 34 that serves the purpose of substantially completely blocking substrate 12 from the linearly directed travel of clustered species 22 while becoming substantially The particular transparent to atomic species 20. The particular dimensioning of transparent and blocking mask members 34 is dependent upon a plurality of parameters including the composition being applied to substrate 12, as well as the density of background gas molecules 26 within confined chamber 28 and further relies upon the particular dimensioning of mask mechanism 34 to provide a blocking shadow greater than a largest dimension of substrate 12 by positional location of masking mechanism 34 at some predetermined location between target 14 and substrate 12 which are merely geometric considerations and parameters dependent upon previously described parametrical considerations.

Assuming Ar atoms or $O_2$ molecules comprise the background gas 26 within chamber 28, the relative weight of such atoms are on the order of 40 atomic mass units (AMU). The weight of atomic species 20 is of the order of 100–1000 AMU. However, the weight of clustered species or droplets 22 have been found to be generally in the range of $10^7$ to $10^9$ AMU. In a pulse laser deposition process, the species 20, 22 leave target 14 with similar kinetic energies which results in the momentum of clustered species 22 having a momentum of approximately $10^4$ larger than species 20. Thus, the higher momentum of species 22 results in less scattering of species 22 than species 20 when colliding with background gas 26.

It is to be understood that additional blocking members may be provided in the construction and implementation of pulsed laser passive filter deposition system 10 in similar construction and relative positional relationship as previously described for partial transparent blocking members 44 and 38. Still further, particular contours of openings formed in partially transparent blocking members associated with system 10 may be varied to provide singular or multiple openings of hexagonal, octagonal, or other closed contour geometric designs.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular locations of elements may be reversed or interposed, all without departing from the spirit or scope of the invention as defined in the appended claims.

What is claimed is:

1. A pulsed laser passive filter deposition system comprising:

(a) a vacuum chamber containing background gas molecules therein;

(b) a substrate to be uniformly coated with a predetermined thin film coating composition, said substrate being substantially planar and located in a substrate plane;

(c) a target member longitudinally displaced from said substrate, said target member being impinged by a pulse laser for emitting said thin film coating composition as a multiplicity of particulates both as an atomic species and as a clustered species in a predetermined emission pattern contour from said target member; and, (d) masking means positionally located between said substrate and said target member for blocking a substantially linear path direction of said clustered species, said blocking means forming a blocking shadow area in said substrate plane having a cross-sectional area greater than a cross-sectional area of said substrate to be coated whereby said clustered species is blocked from impinging on said substrate and said atomic species is deflected by said background gas molecules to provide a deflection path of said atomic species around and through said masking means for impingement on said substrate.

2. The pulsed laser passive filter deposition system as recited in claim 1 where said masking means includes a blocking member of solid construction positionally located between said target member and said substrate, said blocking member having a predetermined cross-sectional area of a dimension wherein a generally conical contour pattern having an apex at a point of impingement of said pulse laser with said target provides a cross-sectional area in a plane of said substrate less than said cross-sectional area of said substrate.

3. The pulsed laser passive filter deposition system as recited in claim 2 where said blocking member is substantially planar in contour.

4. The pulsed laser passive filter deposition system as recited in claim 3 where said blocking member is positioned in a plane substantially normal to said longitudinal direction.

5. The pulsed laser passive filter deposition system as recited in claim 4 where said blocking member is a disc contour.

6. The pulsed laser passive filter deposition system as recited in claim 5 including a first annular contoured disc member axially aligned with said blocking member and longitudinally displaced therefrom, said first annularly contoured disc member having an external diameter greater than a diameter of said blocking member and an internal diameter equal or greater than said diameter of said blocking member.

7. The pulsed laser passive filter deposition system as recited in claim 6 where said blocking member and said first annularly contoured disc member are fixedly secured each to the other.

8. The pulsed laser passive filter deposition system as recited in claim 7 where said blocking member and said first annularly contoured disc member are fixedly secured to each other at a respective peripheral edge of said blocking member and said first annular disc member.

9. The pulsed laser passive filter deposition system as recited in claim 7 where said blocking member and said first annularly contoured disc member are fixedly secured by a securement rod member secured on opposing ends thereof to respective peripheral edges of said blocking member and said first annularly contoured disc member.

10. The pulsed laser passive filter deposition system as recited in claim 6 including a second annularly contoured disc member axially aligned with said blocking member and said first annularly contoured disc member, said second annularly contoured disc member having an external diameter greater than said external diameter of said first annularly contoured disc member.

11. The pulsed laser passive filter deposition system as recited in claim 10 where said second annularly contoured disc member includes an internal diameter equal or greater than said internal diameter of said first annularly contoured disc member.

12. The pulsed laser passive filter deposition system as recited in claim 10 where said second annularly contoured disc member includes an internal diameter substantially equal to said internal diameter of said first annularly contoured disc member.

13. The pulsed laser passive filter deposition system as recited in claim 10 where said blocking member, said first annularly contoured disc member and said second annularly contoured disc member are secured each to the other at respective peripheral edges thereof.

14. The pulsed laser passive filter deposition system as recited in claim 13 where said blocking member, said first annularly contoured disc member and said second annularly contoured disc member are fixedly secured to a securement rod member extending from said second annularly contoured disc member to said blocking member.

15. The pulsed laser passive filter deposition system as recited in claim 6 including a base shield member having a closed contour wall forming an opening wherein said substrate is positionally located.

16. The pulsed laser passive filter deposition system as recited in claim 15 where said base shield member is cylindrical in contour.

17. The pulsed laser passive filter deposition system as recited in claim 16 where said base shield opening has a diameter greater than said external diameter of said first annularly contoured disc member.

18. The pulsed laser passive filter deposition system as recited in claim 16 where said base shield opening bas a diameter greater than a largest dimension of said substrate.

19. The pulsed laser passive filter deposition system as recited in claim 16 where said base shield member is fixedly secured to and longitudinally displaced from said first annularly contoured disc member.

20. The pulsed laser passive filter deposition system as recited in claim 19 including at least one securement rod member fixedly secured to said closed contour wall and said first annularly contoured disc member.

\* \* \* \* \*